United States Patent
Ishizaki (10) Patent No.: US 7,274,570 B2
(45) Date of Patent: Sep. 25, 2007

(54) ELECTRONIC COMPONENT MOUNTING BOARD, ELECTRONIC COMPONENT MODULE, METHOD OF MANUFACTURING ELECTRONIC COMPONENT MOUNTING BOARD, AND COMMUNICATIONS EQUIPMENT

(75) Inventor: Toshio Ishizaki, Hyogo (JP)

(73) Assignee: Matsushita Electric Industrial Co., Inc., Osaka (JP)

( * ) Notice: Subject to any disclaimer, the term of this patent is extended or adjusted under 35 U.S.C. 154(b) by 820 days.

(21) Appl. No.: 10/457,247

(22) Filed: Jun. 9, 2003

(65) Prior Publication Data

US 2004/0240183 A1    Dec. 2, 2004

(30) Foreign Application Priority Data

Jun. 7, 2002    (JP)    ............... 2002-167196

(51) Int. Cl.
*H05K 7/20* (2006.01)
(52) U.S. Cl. ............... 361/715; 361/704; 361/719; 257/712
(58) Field of Classification Search ............ None
See application file for complete search history.

(56) References Cited

U.S. PATENT DOCUMENTS

| | | | |
|---|---|---|---|
| 4,894,271 A | | 1/1990 | Hani et al. |
| 5,506,755 A | | 4/1996 | Miyagi et al. |
| 5,991,162 A | * | 11/1999 | Saso .................... 361/760 |
| 6,097,612 A | * | 8/2000 | Ishikawa et al. ......... 361/794 |
| 6,211,569 B1 | | 4/2001 | Lou |
| 6,242,286 B1 | | 6/2001 | Cellarosi |
| 6,414,847 B1 | * | 7/2002 | Hutchison et al. ........ 361/704 |
| 6,462,950 B1 | * | 10/2002 | Pohjonen ............... 361/704 |
| 6,477,054 B1 | * | 11/2002 | Hagerup ............... 361/720 |
| 6,597,259 B1 | * | 7/2003 | Peters .................... 333/134 |
| 6,671,176 B1 | * | 12/2003 | Barcley ................... 361/719 |
| 6,822,534 B2 | * | 11/2004 | Uriu et al. ............... 333/185 |
| 6,980,439 B2 | * | 12/2005 | Schultz et al. ........... 361/753 |
| 7,023,301 B2 | * | 4/2006 | Kawahara et al. ......... 333/204 |
| 2002/0015291 A1 | * | 2/2002 | Kohjiro et al. ........... 361/760 |

FOREIGN PATENT DOCUMENTS

| | | |
|---|---|---|
| EP | 1 211 730 A2 | 6/2002 |
| JP | 54-048167 | 4/1979 |
| JP | 10-326961 | 12/1998 |
| JP | 2002-261643 | 9/2002 |

OTHER PUBLICATIONS

European Search Report for EP 03 01 2908, dated Aug. 28, 2006.

* cited by examiner

*Primary Examiner*—Boris Chervinsky
(74) *Attorney, Agent, or Firm*—RatnerPrestia (57) ABSTRACT

A ceramic laminated board is provided which has thermal via holes penetrating the inside from the main face of the board. In the thermal via hole, a heat transfer body is placed which has a metallic body and a composite material provided entirely or partially between the metallic body and the ceramic laminated board. The composite material is higher in thermal conductivity than air and is lower in thermal expansion coefficient than the metallic body.

16 Claims, 6 Drawing Sheets

A-A' SECTIONAL VIEW

ELECTRONIC COMPONENT MOUNTING BOARD, ELECTRONIC COMPONENT MODULE, METHOD OF MANUFACTURING ELECTRONIC COMPONENT MOUNTING BOARD, AND COMMUNICATIONS EQUIPMENT

BACKGROUND OF THE INVENTION

1. Field of the Invention

The present invention relates to an electronic component mounting board used for a high-frequency portion of a radio communication apparatus, for example, a transmission module for a radio communication apparatus, and an electronic component module using the board.

2. Related Art of the Invention

In recent years, a number of antenna switch duplexer modules and power amplifier modules are used for the high-frequency part of a radio communication apparatus. Referring to the accompanying drawings, the following discusses conventional individual modules and an example of a high-frequency portion of a radio communication apparatus which combines the modules.

Figure 5:
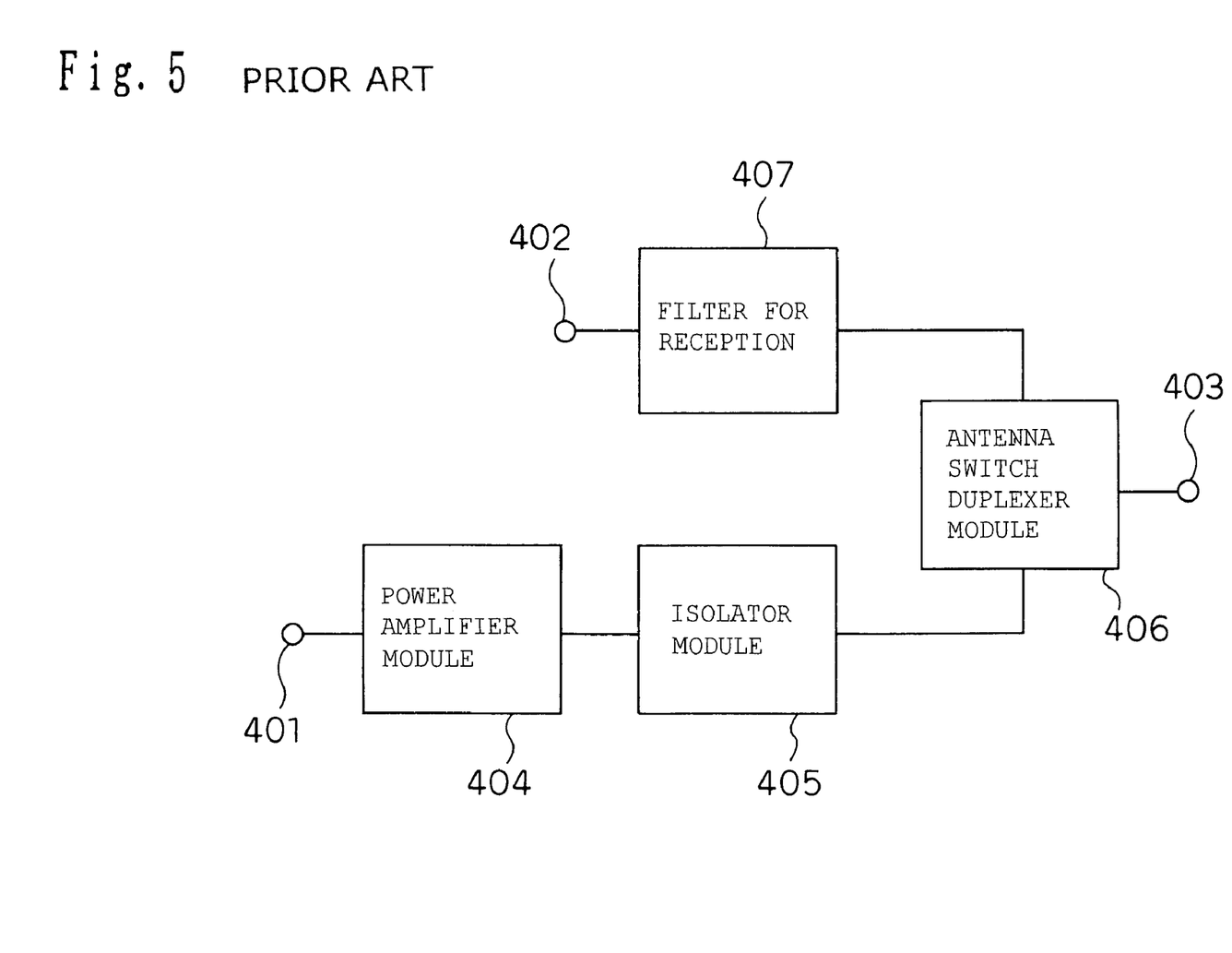
FIG. 5 is a block diagram showing a high-frequency part of a conventional radio communication apparatus.

FIG. 5 is a block diagram showing an antenna switch duplexer module and a power amplifier module in a conventional radio communication apparatus. In FIG. 5, reference numeral 406 denotes an antenna switch duplexer module, reference numeral 404 denotes a power amplifier module, reference numeral 405 denotes an isolator module, and reference numeral 407 denotes a filter for reception.

The antenna switch duplexer module 406 is may use a PIN diode and a compound semiconductor IC of GaAs. The power amplifier module 404 may use a compound semiconductor IC such as GaAs and InGaP. Individually corresponding components are used for the filter for reception 407 and the isolator module 405. These modules and the separate components are arranged on a printed board and are electrically connected via wiring such as a microstrip line.

However, since the above configuration uses separate modules and components, the miniaturization of the radio communication apparatus is limited and it is difficult to reduce the cost in the separate configurations. Further, since the connection is made by wiring on the printed board, impedance is disturbed at a high frequency, desired characteristics cannot be reproduced, and an adjustment step is necessary. Furthermore, the wiring on the printed board causes excessive loss and requires higher power consumption.

Figure 6A:
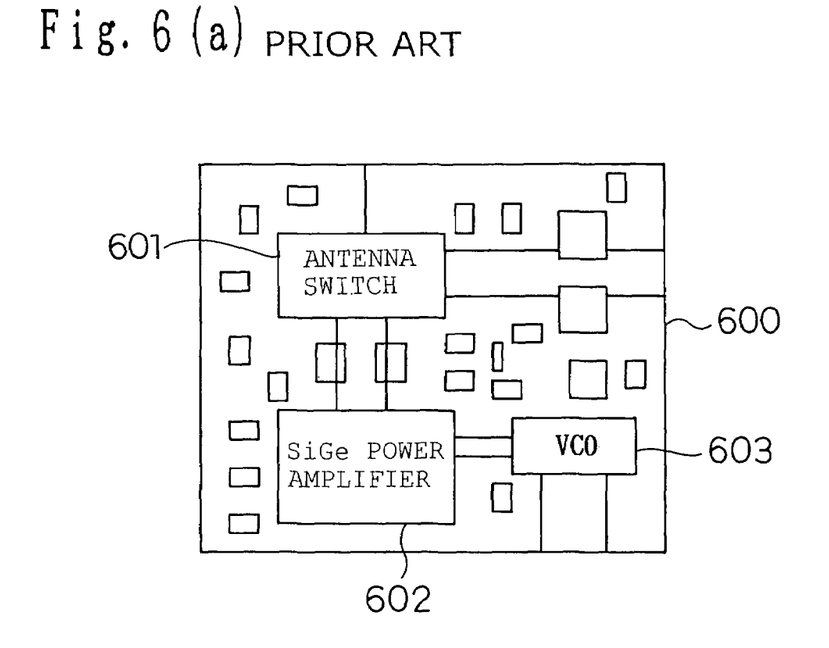
FIG. 6(a) is a plan view showing a conventional radio communication module.
Figure 6B:
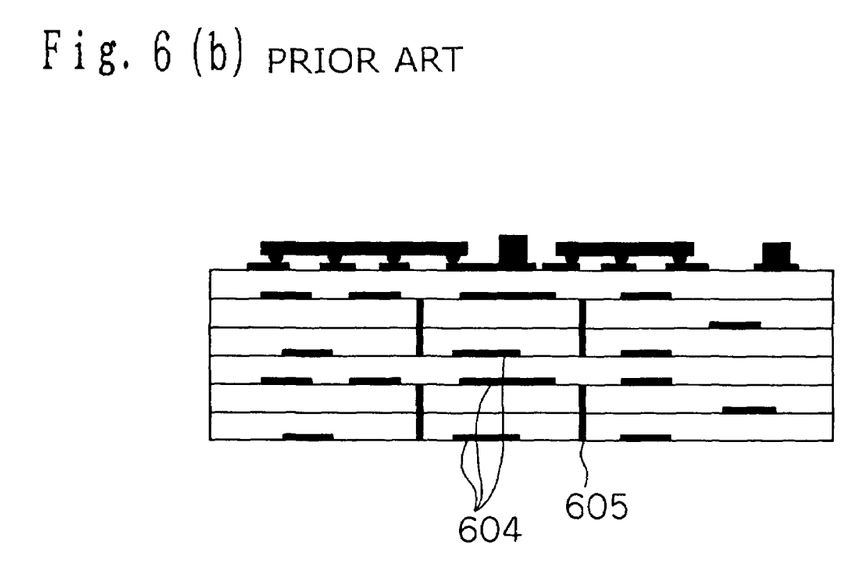
FIG. 6(b) is a side sectional view showing the conventional radio communication module.

In order to solve these problems, as shown in a top view of FIG. 6(a) and a side sectional view of FIG. 6(b), a radio communication module has been proposed in which separate modules such as an antenna switch 601, a power amplifier 602, and a VCO 603, and semiconductor components are flip-chip mounted on a thick-film multilayer board 600 including passive elements 604 (e.g., Japanese Patent Laid-Open No. 2002-261643). The disclosure of Japanese Patent Laid-Open No. 2002-261643 is incorporated herein by reference in its entirety.

However, in the above-described radio communication module, heat has been is released from a component such as the power amplifier 602 which generates a large amount of heat. Particularly when a ceramic multilayer board is used as a thick-film multilayer board, the problem of heat release cannot be ignored.

As shown in FIG. 6(b), via holes 605 making electrical connection are used to release heat from components mounted on a board. However, the use of vias causes a problem described below.

The vias 605 are formed concurrently with the board by filling a metal such as aluminum having conductivity or a thermal conductivity into via holes, which are provided so as to penetrate a green sheet serving as a base of the board, and baking the green sheet thereafter.

While ceramic shrinks during baking, metal thermally expands by the heat of baking. Therefore, as the via hole becomes smaller in diameter, the metal increases in diameter. Thus, when the diameter of the via hole is too small, cracks appear on the via hole due to the expanded metal, resulting in a lower yield during manufacturing.

Meanwhile, when the diameter of the via hole is too large, a gap appears between the metal shrunk after completion of baking and the via hole, resulting in low efficiency of heat release.

SUMMARY OF THE INVENTION

In view of the above problems, the present invention has as its object the provision of an electronic component mounting board, which has an excellent heat releasing property and a high yield during manufacturing. The present invention provides a method of manufacturing the above as well as electronic component modules whereby a smaller size and lower cost are readily achieved. Further, desired characteristics can be realized with preferable reproducibility without making adjustments, and low power consumption can be achieved by suppressing excessive loss.

The $1^{st}$ aspect of the present invention is an electronic component mounting board, comprising a ceramic layer board having at least a via hole penetrating inside from a main face of the board, wherein a heat transfer body having a metallic body and a cushioning material is placed in the via hole, the cushioning material being provided entirely or partially between the metallic body and the ceramic laminated board, and the cushioning material is higher in thermal conductivity than air and is lower in thermal expansion coefficient than the metallic body.

The $2^{nd}$ aspect of the present invention is an electronic component mounting board, comprising a ceramic layer board having at least a via hole penetrating inside from a main face of the board, wherein a heat transfer body having a metallic body and a cushioning material is placed in the via hole, the cushioning material being provided entirely or partially between the metallic body and the ceramic laminated board, and the cushioning material is higher in thermal conductivity than air and is higher in elasticity than the metallic body.

The $3^{rd}$ aspect of the present invention is the electronic component mounting board according to the $1^{st}$ or $2^{nd}$ aspect, wherein the cushioning material is a composite material containing at least a thermosetting resin.

The $4^{th}$ aspect of the present invention is the electronic component mounting board according to the $1^{st}$ or $2^{nd}$ aspect, wherein the ceramic layer board is a laminated board having the same kind or different kinds of ceramic layers.

The $5^{th}$ aspect of the present invention is an electronic component module, comprising:

the electronic component mounting board according to any one of the $1^{st}$ to $4^{th}$ aspects, and an electronic component mounted on the main face, wherein the electronic component is connected so as to conduct heat with the heat transfer body.

The 6th aspect of the present invention is the electronic component module according to the 5th aspect, wherein the electronic component operates in a high-frequency band.

The 7th aspect of the present invention is the electronic component module according to the 5th or 6th aspect, wherein the electronic component is a power amplifier.

The 8th aspect of the present invention is the electronic component module according to the 7th aspect, wherein the power amplifier includes a compound semiconductor power amplifier IC.

The 9th aspect of the present invention is the electronic component module according to the 7th aspect, further comprising an antenna switch circuit mounted on the main face.

The 10th aspect of the present invention is the electronic component module according to the 9th aspect, wherein the antenna switch circuit includes a compound semiconductor switch IC.

The 11th aspect of the present invention is the electronic component module according to the 5th aspect, further comprising a laminated filter provided in the laminated board.

The 12th aspect of the present invention is an electronic component module, comprising:
  a board;
  a power amplifier which is placed on a main face of the board and operates in a high-frequency band; and
  a board buried type laminated isolator which includes a part of the board and is integrally constituted.

The 13th aspect of the present invention is the electronic component module according to the 12th aspect, further comprising a radiator plate thermally connected to a yoke of the board buried type laminated isolator,
  wherein the power amplifier is connected so as to conduct heat with the yoke via the radiator plate.

The 14th aspect of the present invention is the electronic component module according to the 13th aspect, wherein the board buried type laminated isolator is a multiband type isolator having a shared magnetic circuit and a plurality of electric circuits.

The 15th aspect of the present invention is the electronic component module according to the 13th aspect, wherein the electronic component mounting board according to any one of the 1st to 4th aspects is used as the board, and
  the radiator plate is connected so as to conduct heat with the heat transfer body.

The 16th aspect of the present invention is communications equipment, comprising:
  transmitting means; and
  receiving means;
  wherein the electronic component module according to any one of the 5th to 15th aspects is used for the transmitting means and/or the receiving means.

The 17th aspect of the present invention is a method of manufacturing an electronic component mounting board, comprising the steps of:
  opening at least a via hole on a predetermined green sheet;
  baking the green sheet having the opened via hole at a first predetermined temperature to form a ceramic layer board;
  arranging a metallic body in the via hole;
  arranging a cushioning material entirely or partially between the metallic body and an inner wall of the via hole; and
  heating the ceramic layer board at a second predetermined temperature, the board having the metallic body and the cushioning material filled in the via hole;
  wherein the cushioning material is higher in thermal conductivity than air and is lower in thermal expansion coefficient than the metallic body.

The 18th aspect of the present invention is a method of manufacturing an electronic component mounting board, comprising the steps of:
  opening at least a via hole on a predetermined green sheet;
  baking the green sheet having the opened via hole at a first predetermined temperature to form a ceramic layer board;
  arranging a metallic body in the via hole;
  arranging a cushioning material entirely or partially between the metallic body and an inner wall of the via hole; and
  heating the ceramic layer board at a second predetermined temperature, the board having the metallic body and the cushioning material filled in the via hole,
  wherein the cushioning material is higher in thermal conductivity than air and is higher in elasticity than the metallic body.

DESCRIPTION OF SYMBOLS

1 . . . ceramic laminated board
11, 12 . . . power amplifier
13 . . . antenna switch circuit

PREFERRED EMBODIMENTS OF THE INVENTION

Referring to the accompanying drawings, the following will discuss an electronic component mounting board and a transmission module for a radio communication apparatus, the module using the board, according to an embodiment of the present invention.

Figure 1:
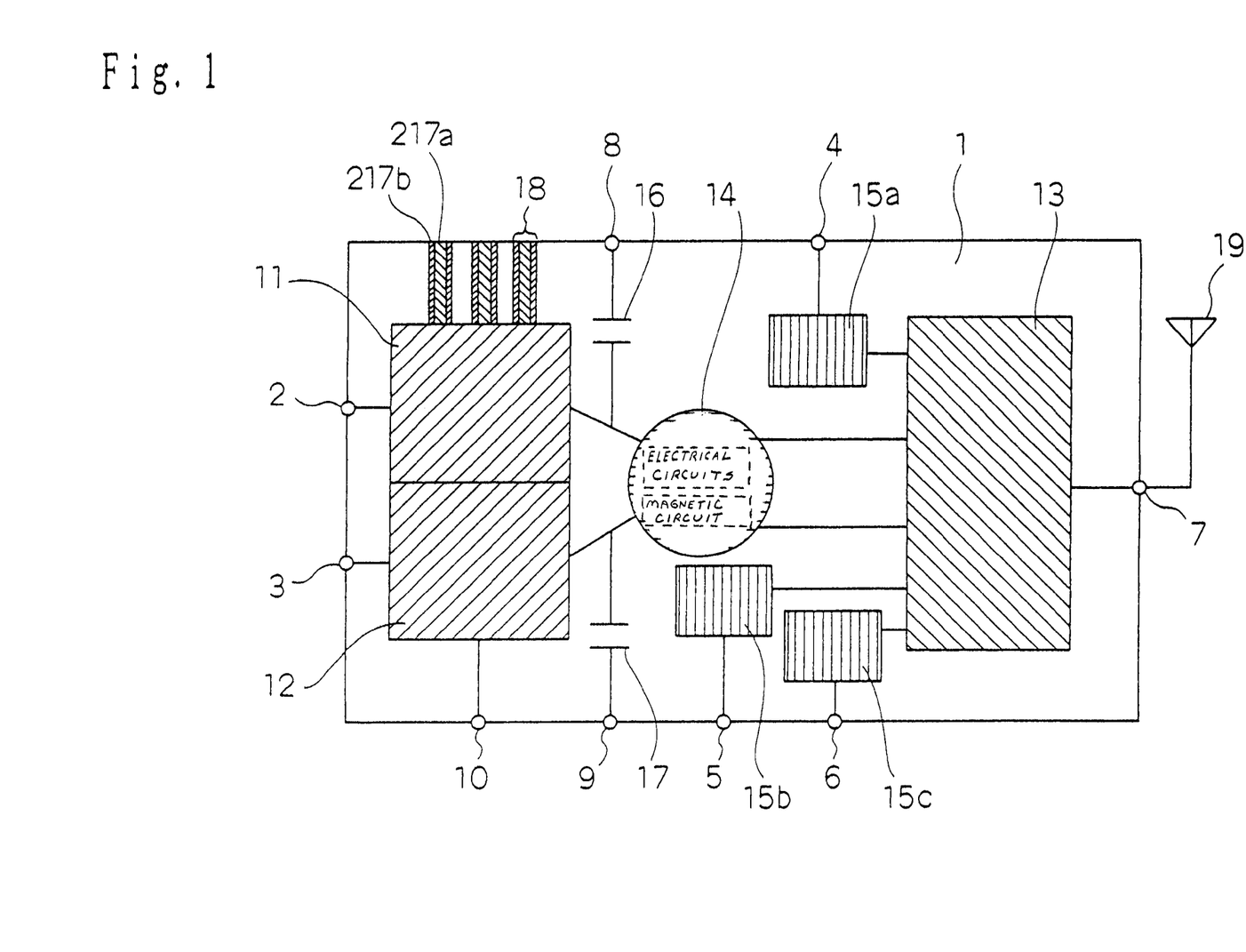
FIG. 1 is a diagram schematically showing a block configuration of a transmission module for a radio communication apparatus according to an embodiment of the present invention.

FIG. 1 shows a concept of a block structure of the transmission module for a radio communication apparatus according to the embodiment of the present invention. Although the following will describe an example of a portable telephone for EDGE of GSM/DCS/PCS, the application of the present invention is not limited to this example.

In FIG. 1, reference numeral 1 denotes a ceramic board which is an example of the electronic component mounting board of the present invention, reference numeral 2 denotes a GSM transmission input terminal, reference numeral 3 denotes a DCS/PCS transmission input terminal, reference numeral 4 denotes a GSM reception output terminal, reference numeral 5 denotes a DCS reception output terminal, reference numeral 6 denotes a PCS reception output terminal, reference numeral 7 denotes an antenna terminal, reference numeral 8 denotes a GSM monitor terminal, reference numeral 9 denotes a DCS/PCS monitor terminal, reference numeral 10 denotes an EDGE mode switching terminal, reference terminal 11 denotes a GSM power amplifier IC, reference numeral 12 denotes a DCS/PCS power amplifier IC, reference numeral 13 denotes a SP5T GaAs switch IC, reference numeral 14 denotes a board buried type laminated isolator, reference numerals 15a, 15b, and 15c denote built-in laminated filters, reference numeral 16 denotes a coupling capacitor for a GSM monitor, reference numeral 17 denotes a coupling capacitor for a DCS/PCS monitor, reference numeral 18 denotes thermal via holes, and reference numeral 19 denotes an antenna.

In this case, it is preferable to use a low-temperature co-fired ceramic board (LTCC) as the ceramic board 1. Both of a single-layer board and a multilayer board can be used for the board 1. A laminated LTCC of different kinds is further preferable in which ceramic sheets having different dielectric constants are laminated. As materials of the ceramic laminated board 1, for example, it is possible to select forsterite, alumina borosilicate glass, and soon from materials having low dielectric constants (relative dielectric constant of 20 or less), and Bi—Ca—Nb—O, Ba—Ti—O, [Zr (Mg, Zn, Nb)]TiO$_4$+MnO$_2$, Ba—Nd—Ti—O, and so on from materials having high dielectric constants (relative dielectric constant larger than 20).

Further, it is preferable to use a material such as GaAs-FET and InGaP-HBT for the GSM power amplifier IC 11 and the DCS/PCS power amplifier IC 12. An FET structure or an HEMT structure is preferable for the GaAs switch IC 13. Although the present embodiment describes an SP5T type, other types may be used. For example, DP5T and a diplexer may be combined and used. In multiple bands of GSM and DSC/PCS, the board buried type laminated isolator 14 stabilizes loads of the GSM power amplifier IC 11 and the DCS/PCS power amplifier IC 12 and performs isolation for securing a low-distortion characteristic. It is preferable to provide a plurality of electric circuits and a shared magnetic circuit to achieve a smaller size and lower cost. The built-in laminated filters 15a, 15b, and 15c can be reduced in size by folding a resonator by using via holes (not shown). Besides, it is further preferable that a resonator electrode Is formed in a ceramic layer of a high dielectric constant in the ceramic board 1.

Figure 2:
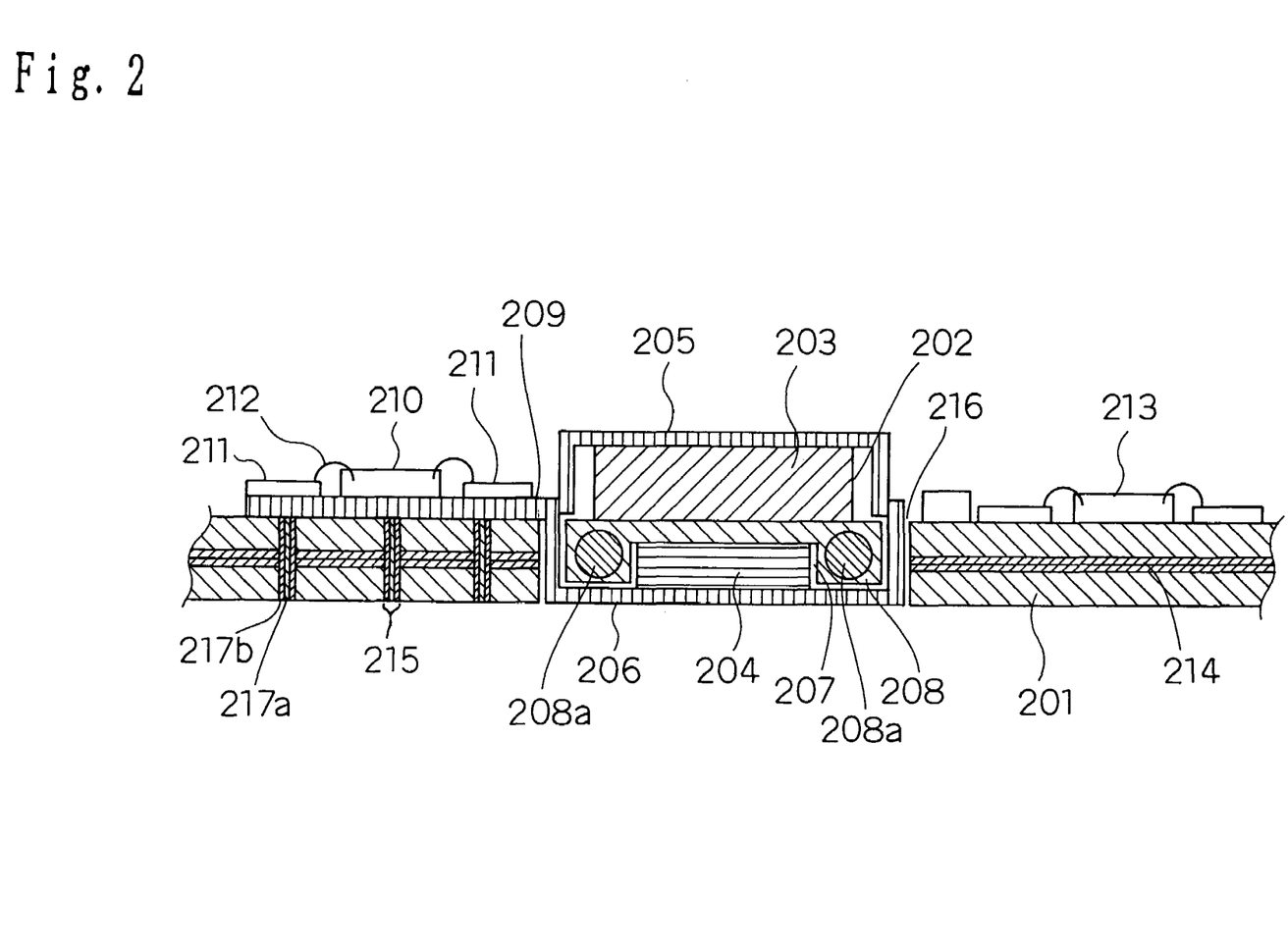
FIG. 2 is a sectional view for explaining an operation of the transmission module for a radio communication apparatus according to the embodiment of the present invention.
Figure 3:
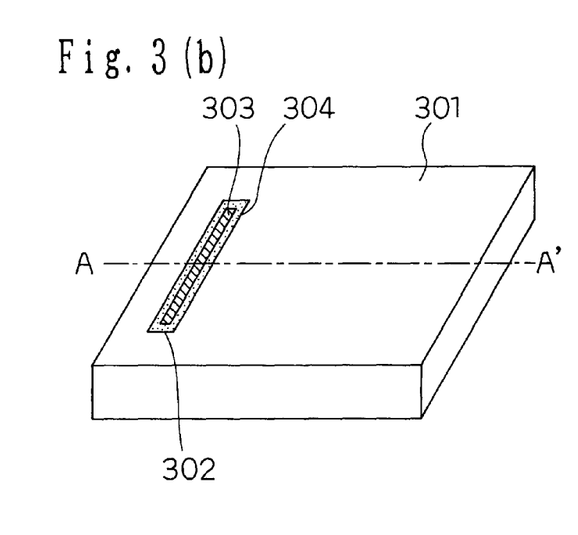
FIG. 3(a) is a diagram showing the step of manufacturing a heat transfer body according to the embodiment of the present invention.
FIG. 3(b) is a diagram showing the step of manufacturing the heat transfer body according to the embodiment of the present invention.
FIG. 3(c) is a diagram showing the step of manufacturing the heat transfer body according to the embodiment of the present invention.

Referring to FIGS. 1, 2, and 3, the following will discuss the operation of the transmission module for a radio communication apparatus that has the above configuration.

First, in FIG. 1, a transmission signal inputted from the GSM transmission input terminal 2 or the DCS/PCS transmission input terminal 3 is amplified to a specified transmission signal output power level by the GSM power amplifier IC 11 or the DCS/PCS power amplifier IC 12. At this point, a bias point is controlled so that the GSM power amplifier IC 11 or the DCS/PCS power amplifier IC 12 operates as a saturation amplifier of amplifying a GMSK modulation signal or a linear amplifier of amplifying an EDGE signal in response to a control signal applied to the EDGE mode switching terminal 10, and the efficiency and distortion characteristics are set in the most suitable manner in each operation mode.

The output from each of the power amplifier ICs is inputted to the board buried type laminated isolator 14. The coupling capacitor 16 for a GSM monitor and the coupling capacitor 17 for a DCS/PCS monitor are provided to take out just a part of the output from each of the power amplifier ICs and monitor an output power level. Although a directional coupler may be used, since the output from each of the power amplifier ICs is connected to the board buried type laminated isolator 14 and thus the directional property can be secured in the present embodiment, a coupling capacitor with a simple configuration, a smaller area, and lower cost is used. The output of the board buried type laminated isolator 14 is inputted to the SP5T GaAs switch IC 13 serving as an antenna switch circuit. Although the GaAs switch IC is used as an antenna switch circuit, a switch circuit using a PIN diode and a switch circuit using an RF-MEMS switch are also applicable.

The antenna switch circuit directs the output of a transmission signal to the antenna terminal during a transmitting operation, and a reception signal received by the antenna 19 is outputted to each receiving terminal via a receiving filter during a receiving operation. As the receiving filter, a laminated filter, an SAW filter, a BAW filter, and so on are used. Members such as the antenna terminal and the receiving filter are constituted integrally with the ceramic laminated board 1 (not shown).

In the transmission module for a radio communication apparatus of the present embodiment, the SP5T GaAs switch IC 13 serving as an antenna switch circuit, the GSM power amplifier IC 11 and the DCS/PCS power amplifier IC 12 that serve as power amplifiers, and the ceramic laminated board 1 are integrally constituted.

In the configuration of the present embodiment, the output of the power amplifier is electrically connected to the output of the antenna switch circuit directly or via the board buried type laminated isolator through a transmission line formed on a surface or an inner layer of the ceramic laminated board. Hence, as compared with connection via a transmission line on a printed circuit board, it is possible to eliminate the disturbance of impedance that is caused by excessive parasitic components and secure the whole characteristics as a module, resulting in no problem in reproducibility of characteristics.

Further, since integration is performed with short wiring and a small size, excessive loss factors do not enter and thus low power consumption can be achieved. This configuration provides a great effect of reducing a load on a battery and permitting a prolonged operation in a radio communication apparatus such as a portable telephone.

Moreover, since the configuration is integrated using the ceramic laminated board, the size can be remarkably reduced and the cost can be lower at the same time.

Incidentally, in the configuration of FIG. 1, a problem arises in heat release of the power amplifier ICs. According to the present embodiment, the board buried type laminated isolator 14 and the thermal via holes 18 are used to release heat, so that the problem can be solved well.

Referring to FIG. 2, the configuration of the transmission module for a radio communication apparatus will be further described in detail. FIG. 2 is a sectional view showing a main part of the transmission module for a radio communication apparatus according to the present embodiment. Reference numeral 201 denotes a ceramic different-kind laminated board, reference numeral 202 denotes a board buried type laminated isolator, reference numeral 203 denotes a magnet, reference numeral 204 denotes a ferrite, reference numeral 205 denotes an upper yoke, reference numeral 206 denotes a lower yoke, reference numeral 207 denotes a lower-surface cavity, reference numeral 208 denotes a ceramic different-kind laminated board integrated with the board 201, reference numeral 209 denotes a radiator plate, reference numeral 210 denotes a power amplifier IC chip, reference numeral 211 denotes a printed board, reference numeral 212 denotes a bonding wire, reference numeral 213 denotes a GaAs switch IC chip, reference numeral 214 denotes a buried type strip line, reference numeral 215 denotes thermal via holes shaped like slits, and reference numeral 216 denotes a slit.

As shown in FIG. 2, the board buried type laminated isolator 202 is configured so that the upper yoke 205 and the lower yoke 205 sandwich a part of the ceramic different-kind laminated board 201 via the slit 216. The magnet 203 is interposed between the upper yoke 205 and one of the main faces of the ceramic different-kind laminated board 201, and the ferrite 204 is interposed between the lower yoke 206 and the other main face of the ceramic different-kind laminated board 201.

Further, a metallic body 217a at the center and a cushioning material 217b are placed in the thermal via hole 215. The cushioning material 217b is provided between the metallic body 217a and the thermal via hole 215 and is in contact with the inner wall of the thermal via hole 215 and the outer wall of the metallic body 217a. Namely, a heat transfer body having a two-layer structure of the metallic body 217a and the cushioning material 217b is filled in the thermal via hole 215. On the ceramic different-kind laminated board, 201, one end of the heat transfer body is directly connected to the radiator plate 209 so as to transfer heat and the other end of the heat transfer body is exposed on the other main face of the ceramic different-kind laminated board 201.

In the configuration of FIG. 2, an important point is that the radiator plate 209 and the lower yoke 206 are directly connect so as to transfer heat, the heat radiator 209 and the upper and lower yokes are operated as heat sinkers, and heat generated from the power amplifier IC chip 210, which is placed on the radiator plate 209, is released to the bottom of the module via the heat transfer body connected to the radiator plate 209. In general, a ceramic LTCC board is not so high in thermal conductivity, which is the most difficult problem when an LTCC is used in a PA module board or a transmission module board. In the present embodiment, this problem can be solved well by the above configuration.

In the board buried type laminated isolator 202, an intersecting electrode (not shown) is formed in a thin laminated ceramic layer between the upper surface of the ceramic different-kind laminated board 201 and the lower-surface cavity 207. The ferrite 204 is embedded in the lower-surface cavity 207. Moreover, a capacitor electrode connected to the end of the intersecting electrode is formed in a part 208a, which is adjacent to the ferrite 204 and has a large thickness, of the ceramic different-kind laminated board 208 interposed between the upper yoke 205 and the lower yoke 206. Additionally, although the present embodiment described the configuration of such a laminated isolator, the present embodiment is not necessarily limited to the above configuration. When the isolator is integrated with the ceramic board, it is understood that the isolator and the board are all included in the scope of the present invention.

Further, the board buried type laminated isolator 202 and the radiator plate 209 are not always baked concurrently with the ceramic different-kind laminated board 201. A composite material is used in which a resin material and a ceramic material are mixed. These materials may be joined to the ceramic laminated board. In this case, the inside of the slit, the lower surface or a surrounding part of the radiator plate, and so on are joined by the composite material. Since the composite material can be usually cured at about 150°, it is possible to prevent cracks and the like caused by a difference in thermal expansion of the radiator plate 209 and the ceramic laminated board 201.

Further, the printed board 211 is placed on a part of the radiator plate 209 and wire bonding is directly performed by the bonding wire 212 and so on from the ICs including the power amplifier IC chip 210 and the GaAs switch IC chip 213, so that the entry of unnecessary parasitic components can be prevented. Further, gold plating is performed so that an electrode on the printed board 211 can undergo wire bonding. For the LTCC board, silver is normally used as a material of the electrode. When wire bonding is performed over the printed board 211, it is not necessary to perform gold plating over the LTCC, thereby reducing the cost.

Figure 4:
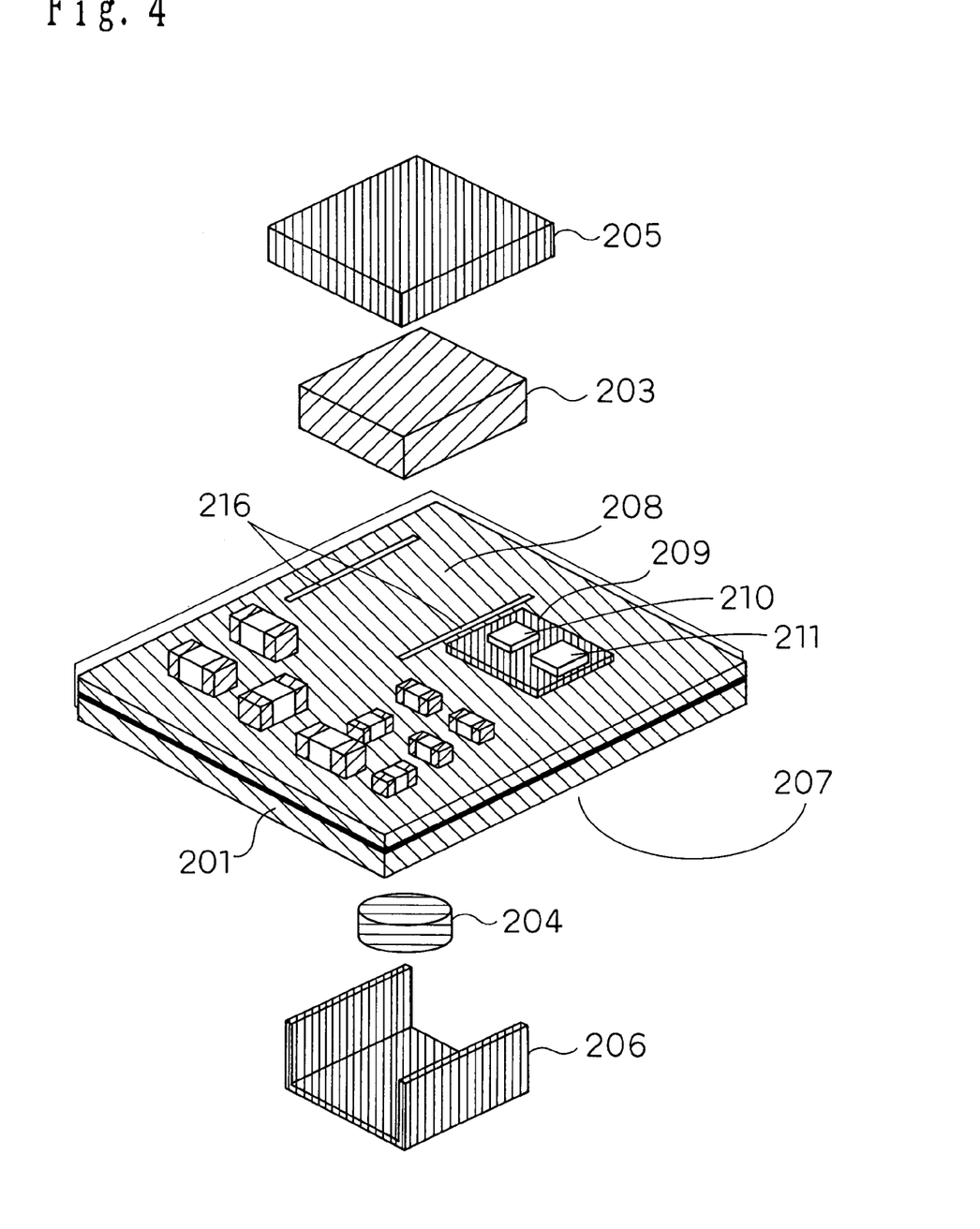
FIG. 4 is an exploded perspective view showing the concept of the transmission module for a radio communication apparatus according to the embodiment of the present invention.

Next, referring to an exploded perspective view of FIG. 4, the following will provide a supplementary explanation on the configuration of the present embodiment. FIG. 4 simply shows an example and the present invention is not limited to this example. A point having not been described in FIG. 1 and FIG. 2 is the slits 216 which are formed in advance to permit the passage of the lower yoke 206. The slits 216 are formed partially on the inside of the outer periphery of the lower yoke 206, so that the board buried type laminated isolator 202 and the ceramic laminated board 201 maintain an integrated structure. Therefore, other circuit parts formed on the board buried type laminated isolator 202 and the ceramic laminated board 201 are electrically connected through their continuous parts, thereby preventing the entry of unnecessary parasitic components.

Subsequently, referring to FIGS. 3(a) to 3(c), the following will discuss the configurations and manufacturing steps of the thermal via holes 215 and the heat transfer body in a more specific manner.

First, as a manufacturing step, as shown in FIG. 3(a) a slit-shaped through hole 302 corresponding to the thermal via hole 215 is formed on a laminated green sheet 301 made of ceramic that serves as a substrate of the ceramic laminated board 201, baking is performed at about 950° C., which is a first predetermined temperature, so as to obtain the ceramic laminated board 201. As a baking method, it is possible to use both of shrinking baking which freely performs shrinking in the three-dimensional directions and non-shrinking baking which does not permit shrinking in a planar direction. Further, although the first predetermined temperature required to bake of the green sheet 301 is about 950° C. in the case of the ceramic laminated board, this temperature varies according to a metal conductor paste used for the buried type strip line 214 and so on, which is baked concurrently with the green sheet 301, and any temperature is acceptable as long as the temperature is equal to or lower than the melting point of the metal conductor paste. For example, when the material is copper, the first predetermined temperature is about 1085°. When the material is silver, the first predetermined temperature is about 962°. In the present embodiment, since silver is used, the first predetermined temperature is set at about 950° C. In short, any temperature is acceptable as long as the ceramic layer substrate of the present invention can be obtained.

Next, as shown in FIG. 3(b), after the ceramic laminated board 201 is baked, a metallic body 303 is inserted into the through hole 302, a gap between the through hole 302 and the metallic body 303 is filled with a composite material 304, thermosetting is performed at about 150°, which is a second predetermined temperature, and the heat transfer body is placed in the thermal via hole 215.

As the metallic body 303, for example, a thin plate (or foil) made of a material such as silver, copper, aluminum, and iron is applicable. In view of thermal conductivity, silver, copper, and aluminum are preferable. However, in the case of connection with the radiator plate 209, iron having a small magnetic resistance is preferable. Moreover, in order to reduce an electrical resistance of high-frequency current, it is also effective to plate a surface of the thin plate with silver or gold.

Further, as the composite material 304 used as an example of the cushioning material of the present invention, for example, it is possible to use a composite material formed by mixing a thermosetting resin made of an epoxy resin and an inorganic filler composed of powder of $Al_2O_3$, MgO, and so on. As described above, the thermosetting temperature of these composite materials is about 150°. As a thermosetting resin, a phenol resin, a cyanate resin, and so on besides an epoxy resin are also applicable. The thermosetting temperature is also about 150° in this case. In short, any temperature can be used as the second predetermined temperature as long as the cushioning material of the present invention is obtained.

After the above steps, as shown in FIG. 3(c) taken along line A-A' of FIG. 3(b), the heat transfer body having a double structure of the metallic body 303 and the composite material 304 can be formed in the ceramic laminated board 201. FIG. 3(c) shows an example in which a part of the heat transfer body exposed onto the main face of the board and a semiconductor element 305 are directly connected to each other so that thermal conduction is obtained. As shown in FIG. 2, the connection may be made via the radiator plate 209.

According to the via holes for heat release that have the above-described heat transfer body, it is possible to prevent a crack or a gap that is caused by a difference in thermal expansion coefficient between the ceramic layer board and the metallic body during baking, thereby improving a yield. Further, it is possible to obtain an integrated structure of the ceramic laminated board and the metallic body so as to obtain the via holes with excellent heat release.

Besides, in the above embodiment, the transmission module for a radio communication apparatus is an example of the electronic component module of the present invention, and the ceramic laminated boards 1 and 201 are examples of the electronic component mounting board or the board of the present invention. Further, the GSM power amplifier IC 11, the DCS/PCS power amplifier IC 12, and the SP5T GaAs switch IC are examples of the power amplifiers and the electronic components of the present invention. Moreover, the thermal via holes 18 and 215 are examples of the via holes of the present invention, the metallic body 303 is an example of the metallic body of the present invention, and the composite material 304 is an example of the cushioning material of the present invention.

However, the present invention is not limited to the above-described embodiment. The electronic components of the present invention may not be power amplifiers or may not operate in a high-frequency band. Moreover, the electronic components may not be semiconductor components. In short, any components are acceptable as long as connection is made to conduct heat with the heat transfer body.

Besides, although the composite material is used as the cushioning material of the present invention, a material of a simple substance is also applicable. In short, a material is not limited by its composition as long as the material is higher in thermal conductivity than air to increase the thermal conductivity of the heat transfer body and the material is lower in thermal expansion coefficient than the metallic body or higher in elasticity than the metallic body to prevent a crack on the ceramic layer board when the material is placed into the via hole. Furthermore, the above explanation described that the composite material 217b is filled into the gap between the through hole 302 and the metallic body 303. However, the cushioning material of the present invention does not need to be arranged over the gap and may be provided only in a part of the gap. Also, although the above explanation described that the via hole is a slit-like thermal via hole, the shape can be arbitrarily changed.

Further, the above embodiment described that the GSM power amplifier IC 11 and the DCS/PCS power amplifier IC 12 that are connected so as to conduct heat with the board buried type laminated isolator 14 are mounted on the electronic component mounting board having the via holes and the heat transfer body of the present invention. The electronic component module of the present invention is not limited by the configuration of the board as long as the board buried type laminated isolator is integrated with the power amplifiers in such a manner that a part of the board is included in the isolator. For example, a conventional ceramic laminated board which has no via hole and heat transfer body of the present invention may be used.

Moreover, the electronic component module of the present invention can be used on both of the transmission side and the reception side of the radio communication apparatus shown in FIG. 5, and the radio communication apparatus using this electronic component module is also included in the present invention. Additionally, the module can be used for electronic equipment other than communications equipment.

As described above, according to the present invention, it is possible to obtain an electronic component mounting board, which has excellent heat release and a high yield during manufacturing, and a method of manufacturing the board, have a smaller size and lower cost with ease, realize desired characteristics with high reproducibility without making adjustments, and suppress excessive loss, thereby achieving low power consumption.

What is claimed is:

1. An electronic component module, comprising:
   a board;
   a power amplifier which is placed on a main face of the board and operates in a high-frequency band; and
   a laminated isolator which includes a part of the board, wherein said isolator is integrally constituted within said board.

2. The electronic component module according to claim 1, wherein the board is a ceramic layer board having at least a via hole penetrating inside from a main face of the board, and
   wherein a heat transfer body having a metallic body and a cushioning material is disposed in the via hole, the cushioning material being provided entirely or partially between the metallic body and the ceramic laminated board, and the cushioning material is higher in thermal conductivity than air and is lower in thermal expansion coefficient than the metallic body.

3. The electronic component module according to claim 1, wherein the board is a ceramic layer board having at least a via hole penetrating inside from a main face of the board, wherein a heat transfer body having a metallic body and a cushioning material is placed in the via hole, the cushioning material being provided entirely or partially between the metallic body and the ceramic laminated board, and the cushioning material is higher in thermal conductivity than air and is higher in elasticity than the metallic body.

4. The electronic component module according to claim 2 or 3, wherein the cushioning material is a composite material containing at least a thermosetting resin.

5. The electronic component module according to claim 2 or 3, wherein the ceramic layer board is a laminated board having the same kind or different kinds of ceramic layers.

6. The electronic component module according to any one of claims 2 or 3, further including an electronic component mounted on the main face, wherein the electronic component is connected so as to conduct heat with the heat transfer body.

7. The electronic component module according to claim 6, wherein the electronic component operates in a high-frequency band.

8. The electronic component module according to claim 6, wherein the electronic component is a power amplifier.

9. The electronic component module according to claim 8, wherein the power amplifier includes a compound semiconductor power amplifier IC.

10. The electronic component module according to claim 8, further comprising an antenna switch circuit mounted on the main face.

11. The electronic component module according to claim 10, wherein the antenna switch circuit includes a compound semiconductor switch IC.

12. The electronic component module according to claim 6, further comprising a laminated filter provided in the laminated board.

13. The electronic component module according to claim 1, further comprising a radiator plate thermally connected to a yoke of the laminated isolator, wherein the power amplifier is connected so as to conduct heat with the yoke via the radiator plate.

14. The electronic component module according to claim 13, wherein the laminated isolator is a multiband type isolator having a shared magnetic circuit and a plurality of electric circuits.

15. The electronic component module according to claim 13, wherein the board includes a ceramic layer board having at least a via hole penetrating inside from a main face of the board, wherein a heat transfer body having a metallic body and a cushioning material is disposed in the via hole, the cushioning material being provided entirely or partially between the metallic body and the ceramic laminated board, and the cushioning material is higher in thermal conductivity than air and is lower in thermal expansion coefficient than the metallic body, and the radiator plate is connected so as to conduct heat with the heat transfer body.

16. Communications equipment, comprising:
transmitting means; and
receiving means;
wherein the electronic component module according to any one of claims 1, 13, 14, to 15 is used for the transmitting means and/or the receiving means.

* * * * *